United States Patent
Chambers et al.

(10) Patent No.: US 8,198,184 B2
(45) Date of Patent: Jun. 12, 2012

(54) METHOD TO MAXIMIZE NITROGEN CONCENTRATION AT THE TOP SURFACE OF GATE DIELECTRICS

(75) Inventors: James Joseph Chambers, Dallas, TX (US); Hiroaki Niimi, Dallas, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 168 days.

(21) Appl. No.: 12/570,620

(22) Filed: Sep. 30, 2009

(65) Prior Publication Data

US 2010/0078738 A1 Apr. 1, 2010

Related U.S. Application Data

(60) Provisional application No. 61/101,322, filed on Sep. 30, 2008.

(51) Int. Cl.
  *H01L 29/78* (2006.01)
  *H01L 21/336* (2006.01)
  *H01L 21/314* (2006.01)
(52) U.S. Cl. ............ 438/585; 257/411; 257/E29.255; 257/E21.267; 257/E21.409; 257/410
(58) Field of Classification Search .......... 257/410, 257/411; 438/585
See application file for complete search history.

(56) References Cited

U.S. PATENT DOCUMENTS

| | | | |
|---|---|---|---|
| 5,858,824 A * | 1/1999 | Saitoh | 438/167 |
| 6,087,229 A * | 7/2000 | Aronowitz et al. | 438/287 |
| 6,171,978 B1 * | 1/2001 | Lin et al. | 438/775 |
| 6,503,846 B1 | 1/2003 | Niimi et al. | |
| 6,518,200 B2 * | 2/2003 | Lin | 438/761 |
| 6,548,366 B2 | 4/2003 | Niimi et al. | |
| 6,610,614 B2 | 8/2003 | Niimi et al. | |
| 6,632,747 B2 | 10/2003 | Niimi et al. | |
| 7,335,607 B2 * | 2/2008 | Cheng et al. | 438/778 |
| 2003/0057432 A1* | 3/2003 | Gardner et al. | 257/100 |
| 2005/0181555 A1* | 8/2005 | Haukka et al. | 438/232 |
| 2006/0051880 A1* | 3/2006 | Doczy et al. | 438/3 |
| 2006/0226500 A1* | 10/2006 | Cheng et al. | 257/410 |
| 2008/0224157 A1* | 9/2008 | Slater | 257/98 |

OTHER PUBLICATIONS

"Gate Dielectric Process Technology for the Sub-1 nm Equivalent Oxide Thickness (EOT) Era;" Colombo et al., The Electrochemical Society Interface, Fall 2007.*

* cited by examiner

*Primary Examiner* — N Drew Richards
*Assistant Examiner* — Robert Carpenter
(74) *Attorney, Agent, or Firm* — Jacqueline J. Garner; Wade J. Brady, III; Frederick J. Telecky, Jr.

(57) ABSTRACT

An integrated circuit having a gate dielectric layer (414, 614, 814) having an improved nitrogen profile and a method of fabrication. The gate dielectric layer is a graded layer with a significantly higher nitrogen concentration at the electrode surface than near the substrate surface. An amorphous silicon layer (406) may be deposited prior to nitridation to retain the nitrogen concentration at the top surface (416). Alternatively, a thin silicon nitride layer (610) may be deposited after anneal or a wet nitridation process may be performed.

8 Claims, 5 Drawing Sheets

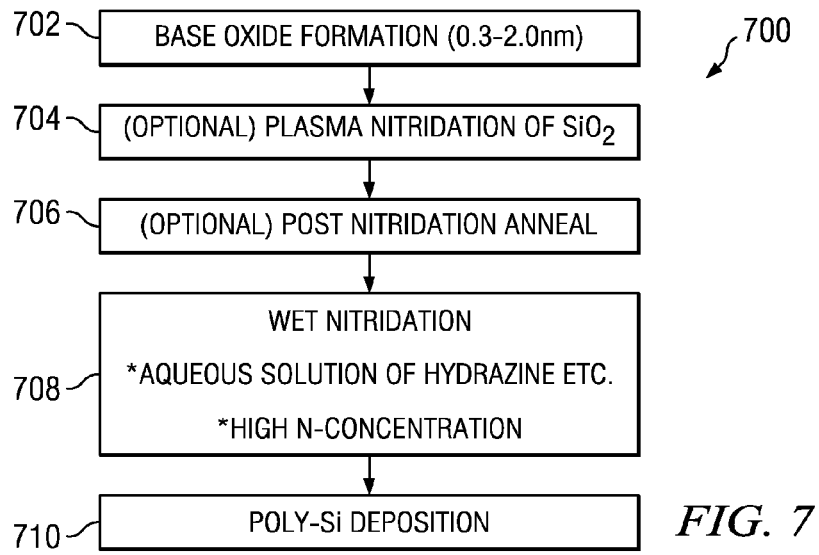
FIG. 7
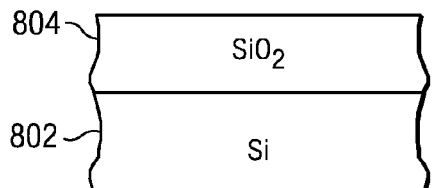
FIG. 8A
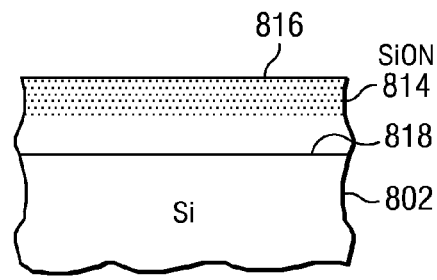
FIG. 8D
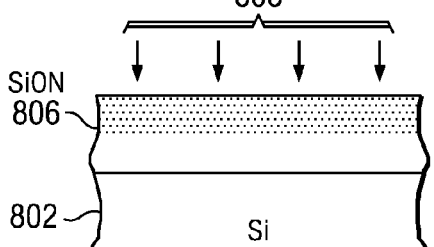
FIG. 8B
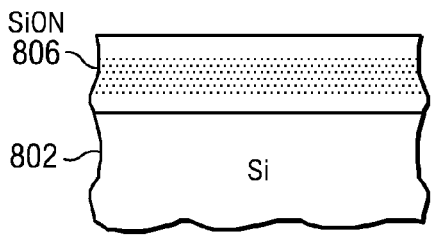
FIG. 8C
FIG. 8E

US 8,198,184 B2

METHOD TO MAXIMIZE NITROGEN CONCENTRATION AT THE TOP SURFACE OF GATE DIELECTRICS

CROSS-REFERENCE TO RELATED APPLICATIONS

The instant application claims priority from U.S. Provisional Application No. 61/101,322, filed Sep. 30, 2008.

FIELD OF THE INVENTION

The invention is generally related to the field of forming gate dielectrics in semiconductor devices and more specifically to forming a gate dielectric having an improved nitrogen concentration at the top surface.

BACKGROUND OF THE INVENTION

As semiconductor devices have scaled to smaller and smaller dimensions, the gate dielectric thickness has continued to shrink. Although further scaling of devices is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide. Because such layers are formed literally from a few layers of atoms, exacting process control is required to repeatably produce such layers. Uniformity of coverage is also critical because device parameters may change dramatically based on the presence or absence of even a single monolayer of dielectric material. Finally, such thin layers form poor diffusion barriers to impurities.

Realizing the limitations of silicon dioxide, researchers have searched for alternative dielectric materials which can be formed in a thicker layer than silicon dioxide and yet still produce the same field effect performance. This performance is often expressed as "equivalent oxide thickness." Although the alternative material layer may be physically thick, it has the equivalent electrical effect of a much thinner layer of silicon dioxide (commonly called simply "oxide"). In some instances, silicon dioxide has been replaced with a silicon-oxy-nitride (SiON).

SiON gate dielectrics are conventionally formed by forming a thin layer of $SiO_2$ and subjecting the $SiO_2$ layer to a nitridation process. This is followed by a thermal anneal performed in oxidizing ambient. However, the thermal anneal tends to denude nitrogen from the top surface portion 102a of the SiON gate dielectric layer 102 as illustrated in FIG. 1. The ideal profile, however, has a nitrogen concentration at the top surface that is either equal to or greater than the nitrogen concentration in the bulk of the film. FIG. 2 is a graph of nitrogen concentration versus depth comparing the actual nitrogen profile after anneal 202 to an ideal nitrogen profile 204. The actual nitrogen profile 202 shows significant nitrogen loss near the surface of the dielectric layer.

SUMMARY OF THE INVENTION

The invention is an integrated circuit having a gate dielectric layer having an improved nitrogen profile and a method of forming such a gate dielectric layer. The gate dielectric layer is a graded layer with a significantly higher nitrogen concentration at the top surface of the dielectric near the gate electrode than near the bottom surface of the dielectric near the substrate. The improved gate dielectric may be achieved by providing a nitrogen source (or an additional nitrogen source) at the surface of the gate dielectric. In one embodiment, an amorphous silicon capping layer is deposited prior to nitridation to retain the nitrogen concentration at the top surface. In another embodiment, a thin silicon nitride layer is deposited after anneal. In yet another embodiment, a wet nitridation process is utilized.

BRIEF DESCRIPTION OF THE DRAWINGS

In the drawings:

FIG. 7 is a flow diagram of a method of forming a gate dielectric according to a third embodiment of the invention.

FIG. 8A-8E are cross-sectional diagrams of a semiconductor device at various fabrications steps according to the embodiment of FIG. 7.

DETAILED DESCRIPTION OF THE EMBODIMENTS

Figure 2:
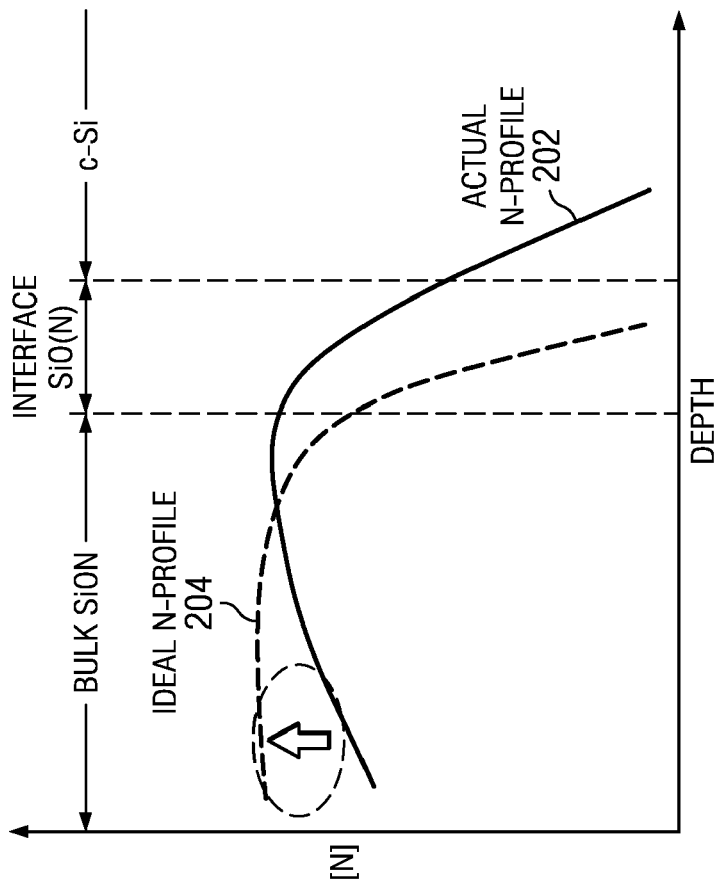
FIG. 2 is a graph of nitrogen concentration versus depth comparing the prior art and ideal nitrogen concentrations.
Figure 1:
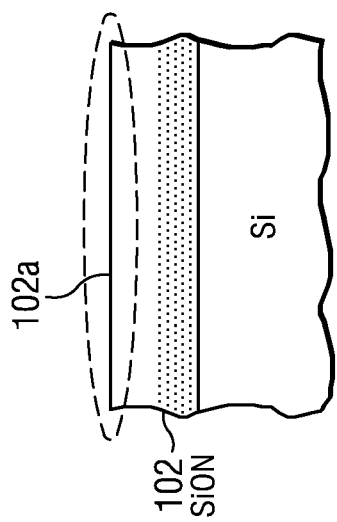
FIG. 1 is a cross-sectional diagram of a prior art SiON gate dielectric layer having decreased nitrogen concentration at the surface.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The embodiments of the invention provide a SiON gate dielectric layer having a maximized nitrogen concentration at the interface between the gate dielectric and the gate electrode. The inventive SiON gate dielectric layer is a graded layer with a N-rich (~30-40 at % N) SiON at the top surface (near the electrode), a layer with less N (<10 at % N) at the bottom surface (near the substrate), and ~1 monolayer of N at the interface with the substrate. The high N layer at the electrode surface helps to reduce leakage by optimizing the tradeoff between the increase of dielectric constant and the decrease in barrier height with increasing N content. The low N layer near the substrate surface improves the mobility since the bonding at the interface is optimized and there is low defectivity. The improved nitrogen grading can be achieved by incorporating a nitrogen source (or an additional nitrogen source) at the surface of the dielectric. Exemplary methods for achieving the improved nitrogen grading are discussed below.

Figure 3:
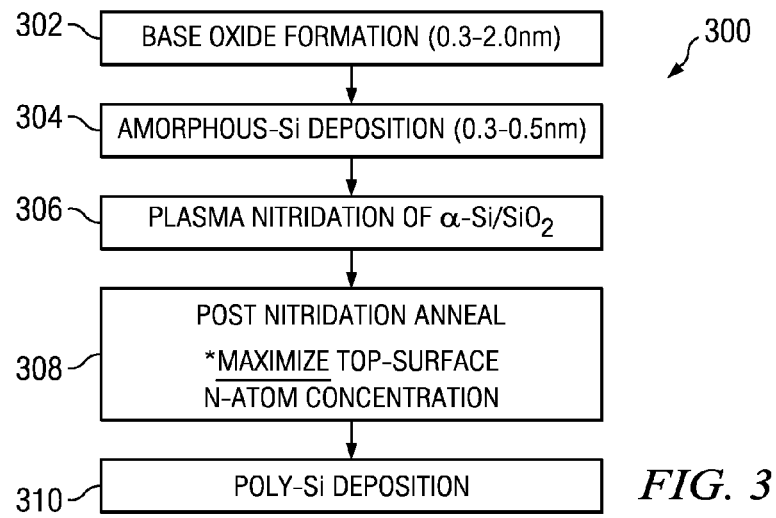
FIG. 3 is a flow diagram of a method of forming a gate dielectric according to a first embodiment of the invention.
Figure 4A:
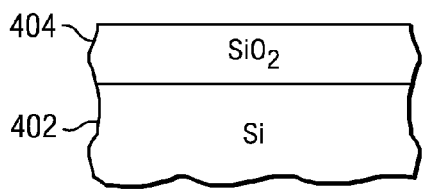
FIG. 4A-4E are cross-sectional diagrams of a semiconductor device at various fabrications steps according to the embodiment of FIG. 3.

A first embodiment of the invention will now be described with reference to FIG. 3 and FIGS. 4A-4E. FIG. 3 is a flow diagram of a process flow 300 for forming a gate dielectric of an integrated circuit (IC) and FIG. 4A-4E are cross-sectional diagrams of the IC at various stages of fabrication. The process begins at Step 302 where a thin base oxide 404 is formed at the surface of a semiconductor substrate 402, as shown in FIG. 4A. Semiconductor substrate 402 is commonly a single crystal silicon wafer, but may be a silicon-on-insulator (SOI) wafer, a hybrid orientation technology (HOT) wafer with regions of different crystal orientations, or other material appropriate for fabrication of integrated circuits. Semiconductor substrate 402 may have been processed through the formation of isolation structures and various implantation and other processes as is well known in the art up through a pre-gate clean operation. After any pre-gate clean processes, the thin base oxide 404 is formed on the surface of substrate 402. Thin base oxide may be formed, for example, using a thermal oxidation process or a plasma oxidation process using at least $O_2$, $N_2O$, and/or NO gas. Thin base oxide 404 may have a thickness in the range of 0.3-2.0 nm.

Figure 4B:
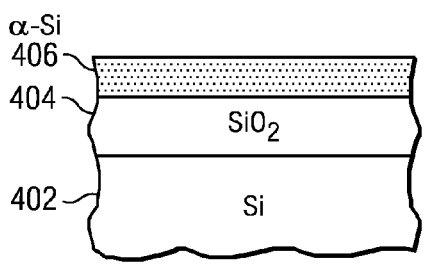

The process continues at Step 304 where a thin silicon layer 406 is deposited over base oxide 404, as shown in FIG. 4B. Thin silicon layer 406 is preferably deposited in an amorphous state. The thickness of silicon layer 406 may be in the range of 0.3 to 2.0 nm. For example, a silane-based chemical vapor deposition (CVD) process may be used to deposit silicon layer 406. An optional anneal may be performed after deposition, if desired.

Figure 4C:
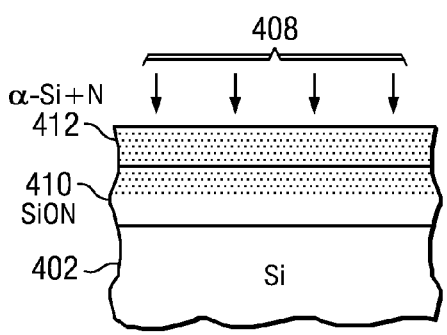

Next, the thin silicon layer 406 and base oxide 404 are subjected to a nitridation process at Step 306. During this step, nitrogen 408 is incorporated into silicon layer 406 and base oxide 404. This converts the base oxide 404 to a SiON dielectric 410 and the silicon layer 406 to a silicon nitride layer 412 as shown in FIG. 4C. The nitridation process may, for example be a plasma nitridation process that incorporates 5-40 atomic % of nitrogen into the base oxide layer 404 and 30-57 atomic % of nitrogen into the silicon layer 406. For example, the nitridation process may be performed at a pressure in the range of 1-100 mTorr, a power of 500-5000 W, and for a duration of 5-150 sec. Alternatively, an ammonia treatment may be used.

Figure 4D:
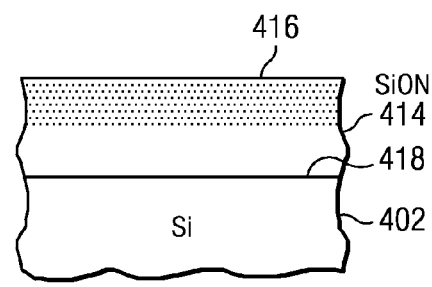

Next, post nitridation anneals are performed at Step 308. Preferably, the post nitridation anneal is performed under slightly oxidizing conditions with a partial pressure of oxygen of ~1-30 Torr. For example, the anneal may be performed at a temperature of 800-1200° C. for a duration of 5-150 sec. As shown in FIG. 4D, silicon nitride layer 412 provides a sufficient nitrogen source to SiON layer 410 such that silicon nitride layer 412 and SiON layer 410 combine to form SiON gate dielectric layer 414 having maximized nitrogen concentration at the surface. SiON gate dielectric layer 414 is a graded layer with a N-rich (~30-40 at % N) SiON at the top (electrode) surface 416, a layer with less N (<10 at % N) near the bottom (substrate) surface 418, and ~1 monolayer of N at the interface 418 with the substrate. The high N layer at the electrode surface 416 helps to reduce leakage by optimizing the tradeoff between the increase of dielectric constant and the decrease in barrier height with increasing N content. The low N layer at the substrate surface 418 improves the mobility since the bonding at the interface is optimized and there is low defectivity.

Figure 4E:
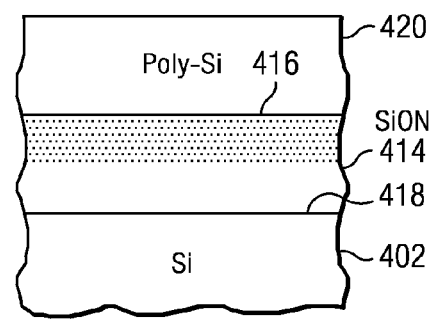

Referring to FIG. 4E, a layer of polysilicon 420 is then deposited over the SiON gate dielectric layer 414 at Step 310. For example, a CVD process using a silane- or disilane-based precursor or sputtering from a silicon solid source may be used. In a preferred embodiment, the processes for nitridation and forming polysilicon layer 420 are clustered. Polysilicon layer 420 may be used to form the gate electrode of the resulting device. Processing then continues to pattern and etch the gate electrode, form source/drain regions, contacts and interconnect levels as is known in the art.

Figure 5:
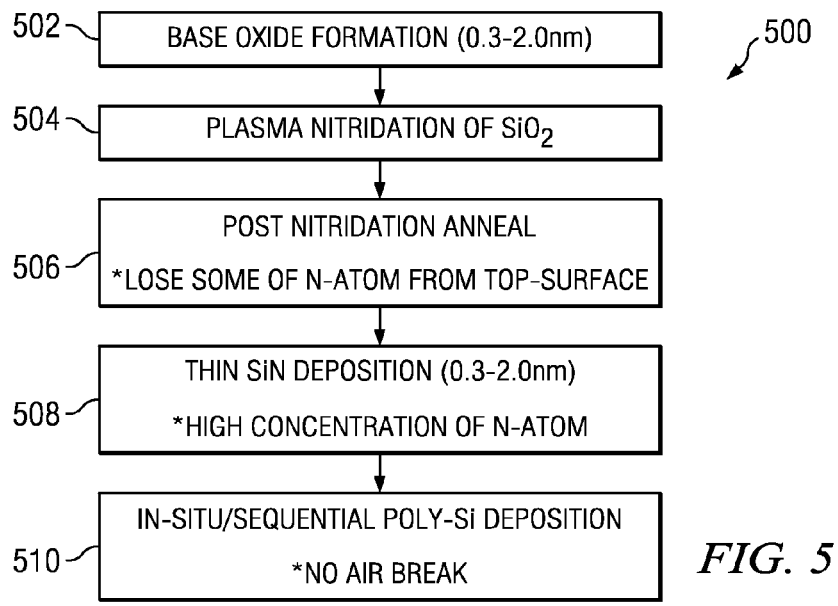
FIG. 5 is a flow diagram of a method of forming a gate dielectric according to a second embodiment of the invention.
Figure 6A:
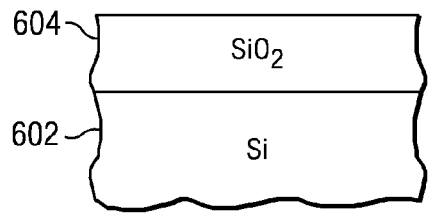
FIG. 6A-6E are cross-sectional diagrams of a semiconductor device at various fabrications steps according to the embodiment of FIG. 5.

A second embodiment of the invention will now be described with reference to FIG. 5 and FIGS. 6A-6E. FIG. 5 is a flow diagram of a process flow 500 for forming a gate dielectric of an IC and FIG. 6A-6E are cross-sectional diagrams of the IC at various stages of fabrication. The process begins at Step 502 where a thin base oxide 604 is formed at the surface of a semiconductor substrate 602, as shown in FIG. 6A. Semiconductor substrate 602 is commonly a single crystal silicon wafer, but may be a silicon-on-insulator (SOI) wafer, a hybrid orientation technology (HOT) wafer with regions of different crystal orientations, or other material appropriate for fabrication of integrated circuits. Semiconductor substrate 602 may have been processed through the formation of isolation structures and various implantation and other processes as is well known in the art up through a pre-gate clean operation. After any pre-gate clean processes, the thin base oxide 604 is formed on the surface of substrate 602. Thin base oxide may be formed, for example, using a thermal oxidation process or a plasma oxidation process using at least $O_2$, $N_2O$, and/or NO gas. Thin base oxide 604 may have a thickness in the range of 0.3-2.0 nm.

Figure 6D:
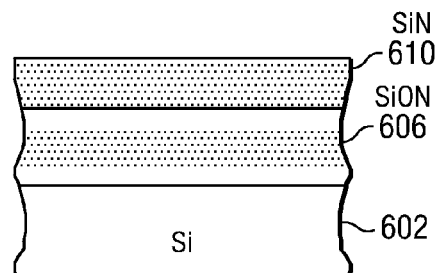
Figure 6B:
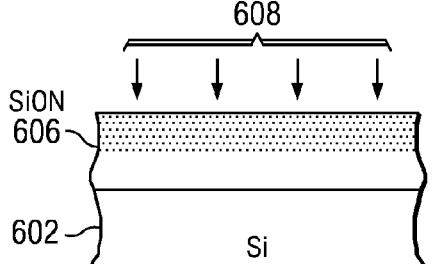
Figure 6C:
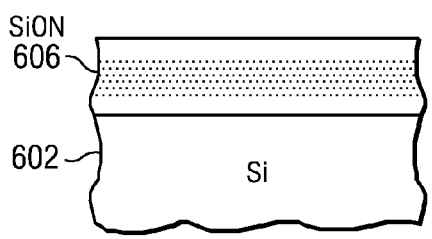
Figure 6E:
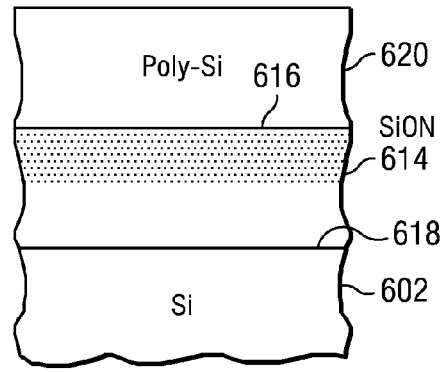

After forming base oxide 604, a nitridation process is performed at Step 504 to incorporate nitrogen 608 into base oxide 604, thus forming SiON layer 606, as shown in FIG. 6B. In a preferred embodiment, plasma nitridation is used to incorporate ~5-40 atomic % nitrogen. For example, the nitridation process may be performed at a pressure in the range of 1-100 mTorr, a power of 500-5000 W, and for a duration of 5-150 sec. Then, a post nitridation anneal is performed at Step 506. The post nitridation anneal is performed under slightly oxidizing conditions with a partial pressure of oxygen of ~1-30 Torr. For example, the anneal may be performed at a temperature of 800-1200° C. for a duration of 5-150 sec. During the post nitridation anneal, nitride loss occurs at the surface of SiON layer 606 as shown in FIG. 6C.

In order to correct for the nitrogen loss at the surface of SiON layer 606, a two-step process (508, 510) is performed as an in-situ/sequential deposition. In other words, the two steps are performed without an air break between them. First, at Step 508, a thin layer of silicon nitride 610 is deposited over SiON layer 606 as shown in FIG. 6D. For example, $SiH_4$, $Si_2H_6$, or BTBAS (bis(tertiary-butylamino)silane) may be used along with $NH_3$ in a chemical vapor deposition (CVD) process to form silicon nitride layer 610 having a higher concentration of nitrogen atoms than the underlying SiON. For example, a maximum concentration of nitrogen should be $Si_3N_4$. The thickness of silicon nitride layer 610 may be in the range of 0.3 to 2.0 nm. Alternatively, other known methods, such as reactive sputter deposition using a silicon solid source and nitrogen gas may be used. Then, at Step 510, a layer of polysilicon gate material 620 is deposited shown in FIG. 6E. For example, a CVD process using a silane- or disilane-based precursor or sputtering from a silicon solid source may be used. Steps 508 and 510 are performed in-situ, sequentially, and with no air break between them. Preferably, Steps 508 and 510 are performed in the same process chamber such as a single wafer deposition furnace or a batch deposition furnace. However, they may alternatively be performed in different chambers of a single clustered tool provided no air break occurs between the two steps.

The presence of SiN layer 610, which has a high concentration of nitrogen, provides additional nitrogen to the gate dielectric resulting in a SiON gate dielectric layer 614 with a maximized nitrogen concentration at the surface. SiON gate dielectric layer 614 is a graded layer with a N-rich (~30-40 at % N) SiON at the top (electrode) surface 616, a layer with less N (<10 at % N) near the bottom (substrate) surface 618, and ~1 monolayer of N at the interface 618 with the substrate.

A third embodiment of the invention will now be described with reference to FIG. 7 and FIGS. 8A-8E. FIG. 7 is a flow diagram of a process flow 700 for forming a gate dielectric of an IC and FIG. 8A-8E are cross-sectional diagrams of the IC at various stages of fabrication. The process begins at Step 702 where a thin base oxide 804 is formed at the surface of a semiconductor substrate 802, as shown in FIG. 8A. Semiconductor substrate 802 may have been processed through the formation of isolation structures and various implantation and other processes as is well known in the art up through a pre-gate clean operation. After any pre-gate clean processes, the thin base oxide 804 is formed on the surface of substrate 802. Thin base oxide may be formed, for example, using a thermal oxidation process or a plasma oxidation process using at least $O_2$, $N_2O$, and/or NO gas. Thin base oxide 804 may have a thickness in the range of 0.3-2.0 nm.

After forming base oxide 804, an optional nitridation process may be performed at Step 704 to incorporate nitrogen 808 into base oxide 804, thus forming SiON layer 806, as shown in FIG. 8B. In a preferred embodiment, plasma nitridation is used. For example, the nitridation process may be performed at a pressure in the range of 1-100 mTorr, a power of 500-5000 W, and for a duration of 5-150 sec. Then, an optional post nitridation anneal may be performed at Step 706. For example, the anneal may be performed at a temperature of 800-1200° C. for a duration of 5-150 sec. During the post nitridation anneal, nitride loss occurs at the surface of SiON layer 806 as shown in FIG. 8C.

At Step 708, a wet nitridation is performed, as shown in FIG. 8D. Wet nitridation allows for a high concentration on nitrogen atoms to be incorporated at the surface of SiON gate dielectric 814. SiON gate dielectric 814 may be the result of wet nitridation applied to the base oxide 804, nitrided SiON layer 806, or annealed SiON layer 806. SiON gate dielectric layer 814 is a graded layer with a N-rich (~30-40 at % N) SiON at the top (electrode) surface 816, a layer with less N (<10 at % N) near the bottom (substrate) surface 818, and ~1 monolayer of N at the interface 818 with the substrate. The wet nitridation is accomplished by the application of a wet reagent containing nitrogen. Suitable reagents include, for example, aqueous or anhydrous solutions of hydrazine, phenylhydrazine, hydralazine, hydrazone, amines (primary, secondary, and tertiary), acid amides (primary, secondary, and tertiary), nitro-aromatics, or nitriles. A preferred wet nitridation may be performed under the following process conditions: a temperature of 25-150° C., a duration of 10 s-10 min; and 1M-10M aqueous or anhydrous solution, for example in tetrahydrofuran (THF). Due to the high reactivity of the wet nitridation reagents and the low thermal energy of the process, nitrogen will only be incorporated into the uppermost exposed surface of SiON gate dielectric layer 814. The target of the wet nitridation is to incorporate 30-40 at. % nitrogen near the top of the dielectric.

If desired, the wet nitridation can be followed by an optional anneal under slightly oxidizing conditions with a partial pressure of oxygen of 1-30 Torr. Then, at step 710, polysilicon gate material 820 is deposited. For example, a CVD process using a silane-based precursor or sputtering from a silicon solid source may be used.

Figure 9:
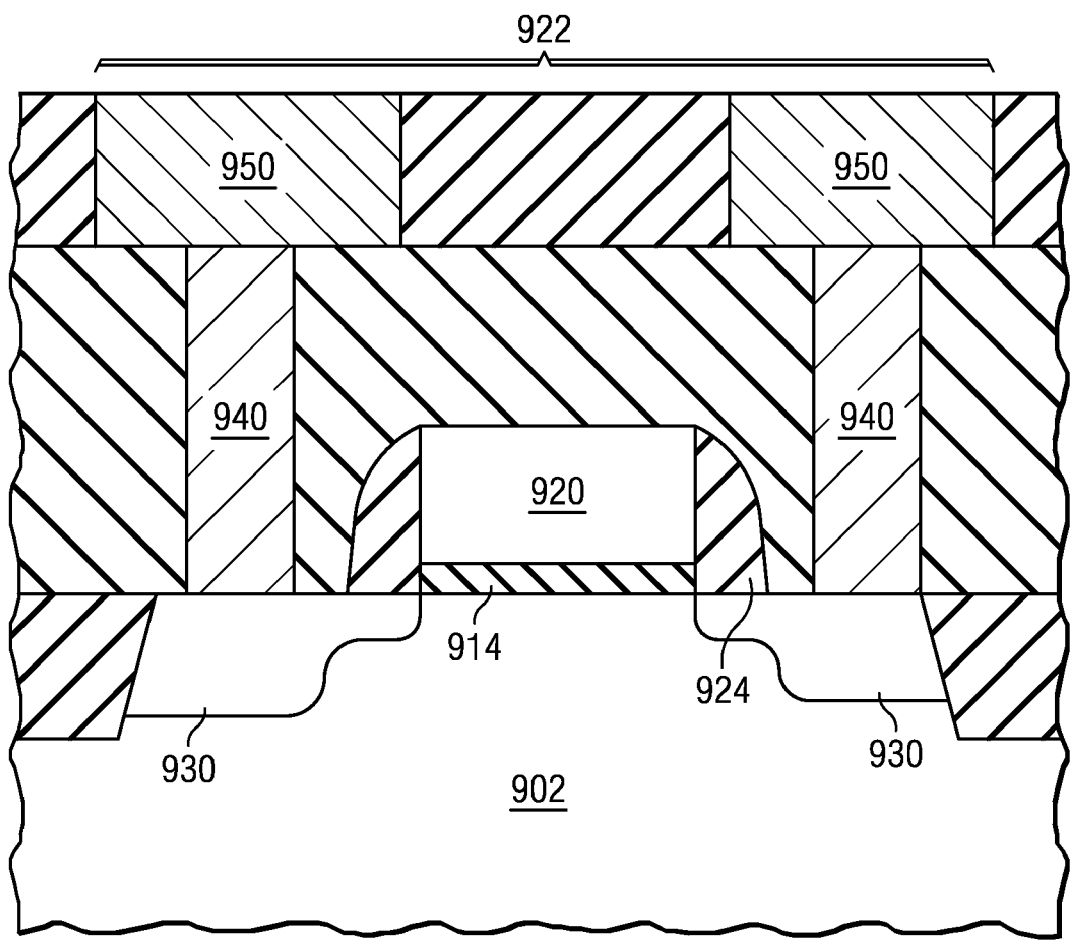
FIG. 9 is a cross-sectional diagram of a semiconductor device including a transistor incorporating a gate dielectric according to the invention.

Upon forming any of gate dielectrics 414, 614, or 814 and polysilicon gate material 420, 620, and 820, processing continues to complete the IC as shown in FIG. 9. Gate dielectric 914 may be formed by any of the methods described above. After depositing the polysilicon gate material and any other gate materials desired, the gate stack may be patterned and etched to form gate electrode 920. Processing then continues as is known in the art to complete the formation of transistor 922 including forming sidewall spacers 924 and source/drain regions 930 as well as forming contacts 940 and interconnect levels 950 to complete the IC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method for fabricating an integrated circuit, comprising the step of:
   forming a SiON gate dielectric layer having a graded nitrogen concentration over a substrate; and
   forming a polysilicon gate electrode layer over the SiON gate dielectric layer, wherein the SiON gate dielectric layer has a higher nitrogen concentration adjacent to the polysilicon gate electrode layer than adjacent to the substrate, wherein the step of forming the SiON gate dielectric layer comprises the steps of:
   forming a base oxide layer over the substrate;
   performing a nitridation process on said base oxide layer to form a SiON layer; and
   annealing the SiON layer, wherein said annealing step denudes nitrogen from an upper surface of the SiON layer; and
   after annealing the SiON layer, depositing a layer of SiN over the SiON layer.

2. The method of claim 1, wherein said nitridation process incorporates 5-40 atomic % of nitrogen into the base oxide layer.

3. The method of claim 1, wherein said annealing step occurs under oxidizing conditions with a partial pressure of oxygen of 1-30 Torr.

4. A method for fabricating an integrated circuit, comprising the step of:
   forming a SiON gate dielectric layer having a graded nitrogen concentration over a substrate; and
   forming a polysilicon gate electrode layer over the SiON gate dielectric layer, wherein the SiON gate dielectric layer has a higher nitrogen concentration near the polysilicon gate electrode layer than near the substrate, wherein the step of forming the SiON gate dielectric layer comprises the steps of:
   forming a base oxide layer over the substrate; and
   performing a wet nitridation process;
   and wherein the step of forming the SiON gate dielectric layer further comprises performing the following steps prior to performing the wet nitridation process:
   performing a nitridation process on said base oxide layer to form a SiON layer; and annealing the SiON layer, wherein said annealing step denudes nitrogen from an upper surface of the SiON layer.

5. The method of claim 4, wherein the step of performing the wet nitridation process wet reagent selected from the group consisting of aqueous solutions of hydrazine, phenylhydrazine, hydralazine, hydrazone, amines, acid amides, nitro-aromatics, and nitriles.

6. The method of claim 4, wherein the wet reagent is provided in tetrahydrofuran.

7. A method of fabricating an integrated circuit, comprising the steps of:

forming a SiON gate dielectric layer having a higher concentration of nitrogen at a gate electrode interface than at a substrate interface by:

forming a base oxide layer;
converting the base oxide layer to a SiON layer;
depositing a layer of silicon nitride over the SiON layer after annealing the SiON layer; and
annealing the SiON layer; and depositing a polysilicon gate material over the SiON gate dielectric layer.

8. The method of claim 7, wherein the step of depositing a layer of silicon nitride and the step of depositing the polysilicon gate material are performed in situ, sequentially, and without an air break in between.

* * * * *